US006596133B1

United States Patent
Moslehi et al.

(10) Patent No.: US 6,596,133 B1
(45) Date of Patent: Jul. 22, 2003

(54) METHOD AND SYSTEM FOR PHYSICALLY-ASSISTED CHEMICAL-VAPOR DEPOSITION

(75) Inventors: Mehrdad M. Moslehi, Los Altos, CA (US); Ajit P. Paranjpe, Sunnyvale, CA (US)

(73) Assignee: CVC Products, Inc., Rochester, NY (US)

( * ) Notice: Subject to any disclaimer, the term of this patent is extended or adjusted under 35 U.S.C. 154(b) by 68 days.

(21) Appl. No.: 09/678,467

(22) Filed: Jun. 14, 2001

(51) Int. Cl.[7] .......................... C23C 14/32; C23C 16/00
(52) U.S. Cl. ........................ 204/192.17; 204/192.15; 204/192.12; 204/298.26; 204/298.11; 438/687; 427/250; 427/255.23; 427/255.28; 427/576; 427/585; 427/595; 118/723 R; 118/723 MP; 118/725
(58) Field of Search .................. 204/192.12, 192.15, 204/192.17, 298.16, 298.26, 298.18, 298.11; 438/687; 427/250, 255.23, 585, 595, 255.28, 576; 118/723 R, 723 MP, 725

(56) References Cited

U.S. PATENT DOCUMENTS

| | | | | |
|---|---|---|---|---|
| 4,492,620 A | * | 1/1985 | Matsuo et al. ......... | 204/192.12 |
| 4,496,450 A | * | 1/1985 | Hitotsuyanagi et al. ................. | 204/192.12 |
| 4,990,229 A | * | 2/1991 | Campbell et al. ...... | 204/298.06 |
| 5,395,642 A | * | 3/1995 | Hamerich et al. ............. | 427/8 |
| 6,066,242 A | * | 5/2000 | Glocker ................. | 204/298.18 |
| 6,238,527 B1 | * | 5/2001 | Sone et al. ............ | 204/192.12 |
| 6,284,655 B1 | * | 9/2001 | Marsh ........................ | 438/681 |
| 6,319,728 B1 | * | 11/2001 | Bhan et al. ................. | 438/687 |

* cited by examiner

Primary Examiner—Rodney G. McDonald
(74) Attorney, Agent, or Firm—Baker Botts L.L.P.

(57) ABSTRACT

An apparatus and method for the deposition of thin film material layers provides improved use of processing chamber space for enhanced processing capability in the fabrication of microelectronic devices. In one embodiment, a physical-vapor deposition target offset from the processing chamber central axis, such as a target having an annular shape and central opening, deposits a material on a substrate while leaving the central region of the processing chamber available for other deposition techniques, including a centrally located sputtering target, CVD showerhead, or ion source. Alternatively, a collimator divides a processing chamber into sub-chambers and allows energetic species from a PVD target or ion source to pass to a substrate located in a separate sub-chamber for interaction with a CVD precursor without mixing the precursor and the plasma associated with the PVD or ion processes. The apparatus supports deposition of material from a single precursor in a manner that mimics atomic layer deposition since the process of subjecting a precursor to energetic species, such as ions or material atoms, allows disassociation of material from the precursor at lower temperatures.

32 Claims, 5 Drawing Sheets

METHOD AND SYSTEM FOR PHYSICALLY-ASSISTED CHEMICAL-VAPOR DEPOSITION

TECHNICAL FIELD OF THE INVENTION

This invention relates in general to the field of fabrication of microelectronic devices, and more specifically, to an apparatus and method for depositing thin film material layers using physical-vapor deposition techniques.

BACKGROUND OF THE INVENTION

Physical-vapor deposition (PVD) techniques are widely used for thin-film deposition processes in microelectronics device fabrication. For instance, the PVD processes are extensively used for thin-film deposition processes for fabrication of semiconductor integrated circuits, magnetic data storage media and thin-film heads, flat-panel displays, and photonic devices. One PVD technique is plasma sputtering which employs a sputtering target placed in a vacuum processing chamber. By applying an electrical (DC or RF) bias to the sputtering target while maintaining a low gas pressure e.g., such as argon gas, within the process chamber, a plasma discharge is produced. The energetic ions from the plasma discharge (e.g., argon ions) bombard the sputtering target surface and generate a sputter flux of the target material. The sputter flux from the target material results in formation of a thin film on a substrate placed within the vacuum process chamber with a view of the sputtering target.

One application of PVD including plasma sputtering is fabrication of copper metallization for silicon chips. PVD of copper can be utilized to form a thin copper seed prior to subsequent copper deposition by electroplating and/or chemical-vapor deposition (CVD). One solution to the difficulties of CVD of copper films is to first deposit a thin seed layer on the substrate to reduce nucleation time and provide better adhesion, and then deposit bulk copper with CVD on top of the seed layer. For instance, PVD of copper provides a uniform and homogeneous seed film with no nucleation delay, good adhesion and negligible contamination with a clean PVD system. Thin film processing systems by PVD generally include a processing chamber with a support for a substrate wafer and a target for depositing material onto the substrate. Typically, atoms are ejected from the surface of a target comprised of the desired deposition material using a number of techniques, such as radio frequency (RF) diode sputtering, magnetron (DC or RF) sputtering, bias sputtering, or other PVD techniques. The ejected atoms are transported to the substrate via a sputter flux where they condense, forming a thin film.

Typical plasma sputtering processing chambers have a single PVD target for depositing a single layer of a desired target material onto a substrate, with the target typically disposed along the central axis of the process chamber and opposed to the substrate. However, manufacturing semiconductor devices often requires depositing multiple layers of different material layers onto a substrate, usually with different deposition techniques. Conventional PVD process chambers that have only a single target are mostly unable or have limited capability to deposit thin films of different materials or to apply different deposition techniques during a single in-situ process. Instead, in order to deposit multiple layers of different materials or to integrate PVD deposition with other deposition techniques, substrates are typically transferred between different process chambers connected either to a cluster tool central wafer handler or along an in-line sputtering system.

Systems for depositing multiple films of different materials onto a substrate typically include multiple processing chambers and an assembly to transport the substrate from one processing chamber to the next. The addition of a transfer assembly or a central wafer handler and multiple processing chambers increases the system cost and complexity, and further decreases wafer processing throughput due to the time spent transferring substrates. Also, the transport of wafers from one processing chamber to the next one presents the risk that contaminants such as particles will be introduced to the substrate, reducing the fabrication yield of a PVD system as substrates are ruined by the contaminants during processing. For example, after a deposition operation, contaminants and particles within the transfer assembly or the substrate support may break off when the transfer assembly robot moves or transfers the substrate. These dislodged particles may then be introduced to a substrate and further contaminate processing operations. To address this problem, the deposition chamber and central wafer handler must be serviced, thereby slowing process flow and consuming valuable time and resources.

One potential solution to the problems related to the deposition of multiple thin film layers is to provide multiple sputtering target electrodes in a single processing chamber. For instance, targets of different material types may be affixed to the lid of a processing chamber with the type of material deposited depending upon the target that receives power. Alternatively, the substrate or target may be moved to align with each other as disclosed by U.S. patent application Ser. No. 09/067,143, entitled "Apparatus and Method for Multi-Target Physical-Vapor Deposition of a Multi-Layer Material Structure," by Moslehi, et al. However, processing chambers with multiple target electrodes may result in contamination of targets and substrates by the material of the different targets, thereby affecting process reliability and repeatability. For example, in a single chamber with more than one target, deposition from a first target may cross contaminate a second target when material from the first target interacts with the second target. The second target is then contaminated with material from the first target, thereby effecting process repeatability and cleanliness.

SUMMARY OF THE INVENTION

Therefore, a need has arisen for a deposition apparatus and method that supports physical-vapor deposition of a material onto a substrate with a target distal from the central axis region of a processing chamber.

A further need exists for a deposition apparatus and method for physical-vapor deposition from plural fixed targets onto a substrate in a single processing chamber.

A further need exists for an apparatus and method for depositing plural materials from plural targets in a single deposition chamber in which target and substrate movement are minimized to reduce the risk of contamination.

A further need exists for an apparatus and method that combines physical-vapor deposition and chemical-vapor deposition techniques in a single processing chamber to deposit one or more materials on a substrate.

A further need exists for an apparatus and method that combines one or more of physical-vapor deposition, ion beam deposition and chemical-vapor deposition techniques for thin film deposition of one or more materials in a single processing chamber.

A further need exists for an apparatus and method that supports atomic layer deposition of copper with chemical-vapor deposition using a copper-based precursor.

A further need exists for an apparatus and method that subjects a chemical-vapor deposition precursor to energetic species that aid in the disassociation of material from the precursor for deposition of material on a substrate at reduced processing temperatures.

In accordance with teachings of the present invention, an apparatus and method of use are provided that substantially eliminate or reduce disadvantages or problems associated with previously developed thin material film deposition apparatus and methods. More effective use of processing chamber space allows deposition using plural materials and plural deposition techniques within a single processing chamber.

In one embodiment, a PVD target offset from the central axis of the processing chamber avoids interference with material deposition from a primary PVD target or a CVD showerhead, or treatment of deposited material with an ion beam from an ion source. More specifically, an annular-shaped PVD target assembly is disposed between a substrate and a primary deposition source, such as a PVD target or CVD showerhead, or an ion source. The annular target defines a deposition area with the inner circumference of its opening. Material passes through the opening for deposition on the substrate, and is also provided from the annular target.

The annular target supports deposition of plural materials in a single processing chamber if the annular target is comprised of a different material from the material deposited by a primary PVD target located along the central axis or the material deposited by a CVD precursor. When used with a PVD target, sequential deposition within a single processing chamber allows the fabrication of multilayer laminates without transfer of the substrate. PVD plasma in the processing chamber is constantly maintained by alternating and somewhat overlapping the power applied to each target and by establishing deposition with the sequential target before ceasing deposition with the current target. Alternatively, co-deposition from both targets results in deposition of an alloy having its relative composition of each material dependent upon the relative deposition rate of each target. The thickness and composition of the material film is also controlled by the relative position of the substrate and the annular target. For instance, lowering or raising the substrate varies the concentration of material deposition across the surface of the substrate.

The annular target can be used in conjunction with an ion source to enhance the film deposited on a substrate with a single material type. For instance, the use of an ion source along the central axis enhances control of the micro-structure of the film deposited by the annular target. Alternatively, either an inert or a reactive ion stream may be used to alter the microstructure and/or composition of as-deposited film, either through sequential or concurrent ion bombardment. For instance, an oxygen plasma with an ion source enables sequential or concurrent deposition of aluminum or silicon for $Al_2O_3$ or $SiO_2$ film deposition.

When used with a CVD precursor, the annular target supports deposition of underlying layers, such as seed or barrier layers, followed by CVD process without the transfer of the substrate from the processing chamber. Alternatively, the annular target provides energetic species that aid in the disassociation of material atoms from CVD precursor. One example is the deposition of a seed copper layer by PVD from the annular target with or without concurrent CVD deposition. For instance, PVD of a copper film having a thickness of 100 to 200 angstroms provides a surface on which CVD copper precursor can adsorb with minimized nucleation delay. Upon completion of PVD seed layer deposition, PVD-assisted CVD uses energetic copper atoms from the annular target to aid in the disassociation of copper from the precursor at deposition temperatures that are substantially lower the deposition temperature of the precursor in the absence of energetic species. PVD-assisted CVD, either by subjecting the precursor to copper atom flux on a concurrent or sequential basis, deposits a conformal, continuous thin copper film of approximately 200 angstroms or less with a deposition pressure of approximately 1–10 mTorr. The PVD-assisted CVD copper film provides an excellent seed layer for bulk CVD of copper to a desired thickness.

In another embodiment that supports PVD-assisted CVD, a collimator is used to separate the processing chamber into sub-chambers, thus avoiding the interaction of PVD or ion plasma with CVD precursor. An ion source or PVD target located in one sub-chamber provides energetic species, such as energetic ions or copper atoms, through the collimator and towards the substrate. CVD precursor flows in the other sub-chamber proximate the substrate for depositing material so as to be subject to bombardment by the energetic species. The energetic species interact with the precursor to aid the disassociation of material from the precursor for deposition on the substrate. Precursor and plasma interaction is prevented by the presence of the collimator and the evacuation of gas proximate the collimator.

The present invention provides a number of important technical advantages. One important technical advantage is provided by the availability of plural targets in a single processing chamber. Alignment of the annular target's opening with the central axis of the processing chamber allows the use of the central deposition area for conventional deposition techniques with supplementation by deposition from the annular target. Thus, plural materials may be deposited on a substrate within a single processing chamber without substrate or target movement. This reduces the risk of contamination of the substrate and increases process throughput by reducing substrate transfer time. In addition, the use of plural targets reduces process complexity by reducing the number of processing chambers needed to deposit multilayer material stacks.

Another important technical advantage is provided by the combination of plural deposition techniques within a single processing chamber. For instance, the annular target may assist in the disassociation of material from a CVD precursor or may act as the primary deposition source with assistance from an ion source directed along the central axis. Thus, for example, the annular target may provide an enhanced seed layer having a microstructure controlled by with the assistance of an ion stream. As another example, the annular target may deposit a material whose composition is then altered by a reactive ion stream. Alternatively, energetic atoms or species from the annular target may assist CVD precursor disassociation of deposition material, allowing a decrease in CVD deposition temperature and improving thin film adhesion.

Another advantage of the present invention is the mimicking of Atomic Layer Deposition (ALD) with a single precursor. Precursor flows over the substrate at a temperature below the precursor's conventional deposition temperature with disassociation of material from precursor enhanced by the interaction of energetic species with the precursor. A collimator and associated pumping manifold maintain separation of the precursor and the plasma associated with the energetic species. The lower deposition temperature suppresses spontaneous deposition and reduces premature decomposition of the precursor while the energetic species drives the CVD process to completion. Deposition of incremental thin film layers, either with sequential or concurrent application of energetic species to the precursor, mimics ALD, thus enhancing film quality with reduced deposition temperatures. The resulting layer provides an excellent seed for bulk CVD of copper, with the seed having a thin, conformal and continuous quality with good adhesion and low interface resistance.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Preferred embodiments of the present invention are illustrated in the figures, like numerals being used to refer to like and corresponding parts of the various drawings.

Deposition of thin material layers to fabricate microelectronic devices, such as microprocessors, and storage devices, such as magnetic tunnel junction devices for thin-film storage heads, has grown increasingly complicated with the introduction of new materials and decreased device structure dimensions. The use of copper for wire lines and vias is one example. Deposition of copper-based structures generally require a number of additional steps under demanding processing constraints when compared with the deposition of conventional material structures, such as aluminum structures. With conventional material deposition apparatus and methods, additional processing steps typically mean transfer of the substrate between different processing chambers, with each processing chamber used to accomplish a single processing step. Multiple transfers slow processing due to transfer time and increase the likelihood of contamination of substrates.

The present invention improves process efficiency by incorporating multiple thin film deposition techniques in a single processing chamber. For instance, conventional deposition apparatus and methods dispose a material source, such as a PVD target or CVD showerhead, opposite a substrate aligned along a central axis of a processing chamber, with the substrate substantially perpendicular to the central axis. However, this arrangement's use of the central axis as the deposition region make it difficult to combine multiple deposition techniques in a single processing chamber.

To overcome this difficulty, the present invention improves the use of the space provided in the processing chamber. For instance, in one embodiment, a PVD target is offset from the central axis to provide material to the substrate at an angle offset from perpendicular. More specifically, the PVD target has an opening, such as the central region of an annular ring, that allows other deposition techniques, such as CVD precursor or an ion stream, to occur along the central axis. In another embodiment, the processing chamber is divided into subchambers that each support a deposition technique. For instance, a collimator maintains a plasma for a PVD target or an ion source in one region of the processing chamber and allows energized species to interact with a CVD precursor distributed over a substrate in another region of the processing chamber. These and other embodiments enhance processing efficiency by reducing the need to transfer the substrate between processing steps and by combining the advantages of different deposition techniques for a given material deposition.

Figure 1:
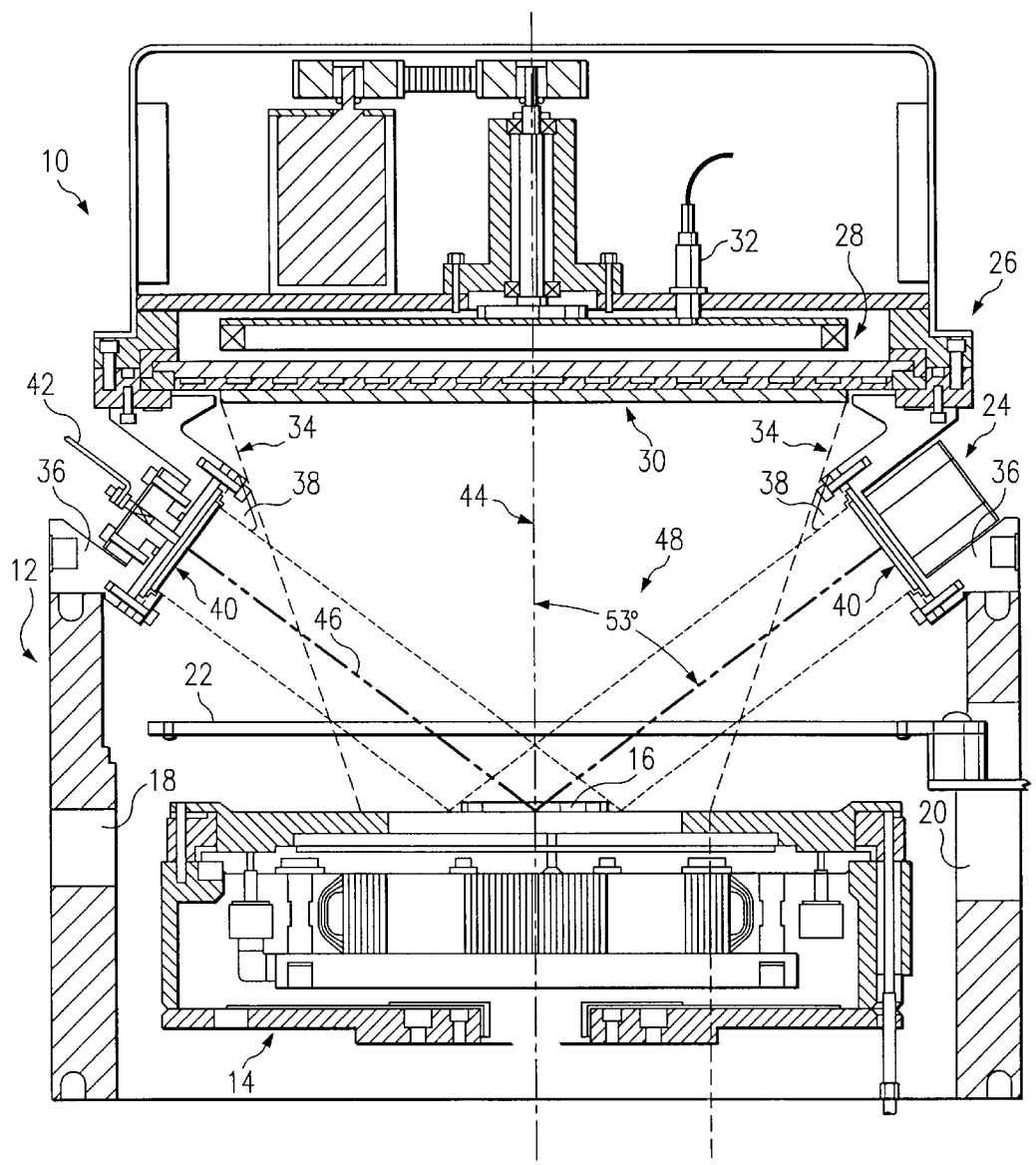
FIG. 1 depicts a side cutaway view of an apparatus for depositing material onto a substrate with an annular target.

Referring now to FIG. 1, a side cutaway view of a deposition processing chamber 10 is depicted as implemented with a drop-in annular-shaped target. A processing chamber housing 12 contains a substrate support chuck 14 which supports a substrate 16 during deposition processing. Processing chamber housing 12 has a slot 18 for transferring wafers into and out of deposition processing chamber 10, and a shutter slot 20 through which a shutter 22 is inserted and retracted during processing. Substrate support chuck 14 moves vertically to adjust the relative vertical position of substrate 16 within the processing chamber housing 12. Substrate support chuck 14 may include conventional temperature control devices for operationally controlling the thermal energy level of substrate 16, and substrate handling devices for enabling the transfer of substrate 16 into and out of a position for processing.

An annular-shaped target assembly 24 is coupled to the upper edge of processing chamber housing 12 with an airtight seal. A processing chamber lid 26 couples to the upper edge of drop-in annular-shaped target assembly 24, also with an airtight seal, to form deposition processing chamber 10. Annular target assembly 24 acts as an intermediary level between processing chamber lid 26 and processing chamber housing 12. Thus, for instance, annular target assembly 24 may be incorporated as a modular "drop-in" component which is then integrated as part of deposition processing chamber 10. This enables the annular target assembly 24 to be included as original equipment for a processing chamber or to be introduced as an add-on feature to retrofit conventional deposition (PVD) processing chambers having a single target into multi-target processing chambers. In order to retrofit a conventional processing chamber, annular target assembly 24 may use a lower edge adapted to couple to processing chamber housing 12 with the attachment points of processing chamber lid 26, and an upper edge having the coupling attachment points of processing chamber housing 12 to couple with the attachment points of processing chamber lid 26.

The lower interior surface of processing chamber lid 26 forms a target support or backing plate 28 that supports a target 30 in a position relative to substrate 16 for physical-vapor deposition of material from target 30 onto substrate 16. A power source 32, such as conventional DC or RF power, enables physical-vapor deposition of material from target 30 through a plasma within processing chamber 10 onto substrate 16. Material from target 30 transitions to substrate 16 within the volume defined by lines 34. Annular target assembly 24 includes a target support 36 having an upper lip or shield 38 that defines the deposition area for target 30 within lines 34. Target support 36 supports a target 40 that is protected from deposition of material from target 30 by the protrusion of upper lip or shield 38 along lines 34. Target 40 receives power from power source 42, such as conventional DC or RF power, to enable deposition of material from target 40 onto substrate 16.

Target 30 is arranged to face substrate 16 for physical-vapor deposition of material from target 30 onto substrate 16 in a conventional manner. Target 30 and substrate 16 are aligned along a central axis 44, opposing each other in a manner substantially perpendicular to the central axis. Target 40, in contrast, is directed at substrate 16 along an offset target axis 46 that is offset from central access 44 by an offset angle, depicted as 53 degrees by arc 48, although the actual angle may vary over a range between 10° and 90°. In this manner, when power is applied to target 40, material from target 40 proceeds along axis 46 to deposit on substrate 16. Substrate support chuck 14 moves substrate 16 vertically so that the intersection of axis 46 and axis 44 occurs at approximately the surface of substrate 16 during deposition from target 40, although a precise intersection is not a necessary condition. During deposition from target 30, substrate support chuck 14 moves substrate 16 vertically to an appropriate distance from target 30.

Shutter 22 projects from shutter slot 20 to intercede between target 30, target 40 and substrate 16 when blockage of deposition from target 30 and target 40 is desired. For instance, shutter 22 may be extended into deposition processing chamber 10 to allow the establishment of plasma, and then may be retracted to allow deposition of material from target 30 and target 40 onto substrate 16. In one embodiment, shutter 22 supports deposition of material with a shutter target as disclosed in U.S. patent application Ser. No. 09/662,575, filed Sep. 15, 2000, now U.S. Pat. No. 6,444,103 entitled Method and Apparatus for Thin Film Deposition Using an Active Shutter by Moslehi, et al. incorporated herein by reference. Thus, use of a shutter target allows deposition of three different types of materials in a single processing chamber: a first material type associated with target 30, a second material type associated with target 40 and a third material type associated with a shutter target 49 coupled to shutter 22.

Figure 2:
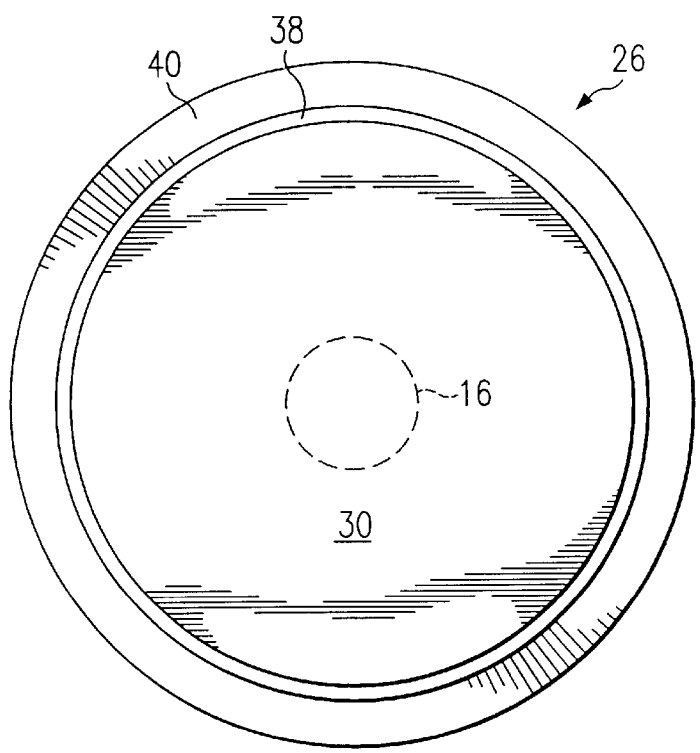
FIG. 2 depicts a view from the bottom of a processing chamber having an annular target.
Figure 2A:
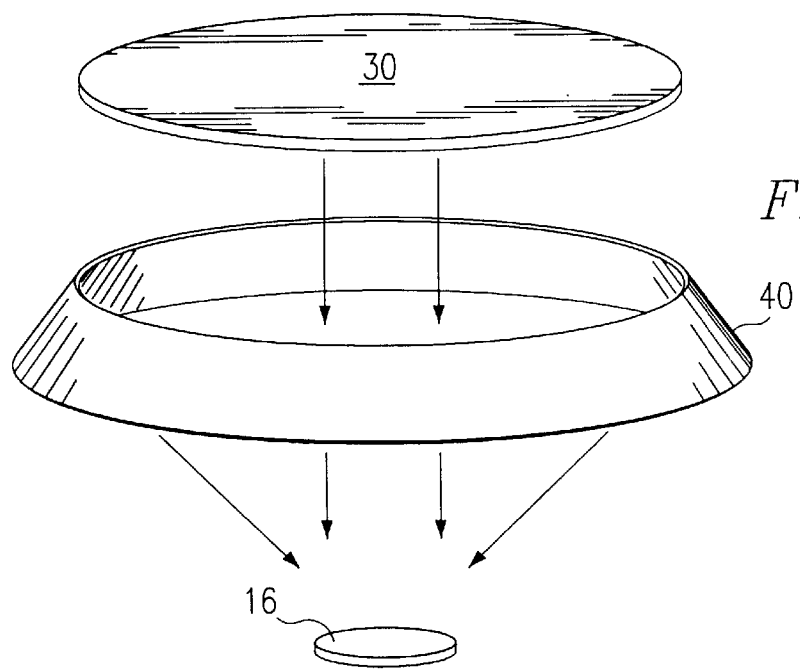
FIG. 2A depicts a blow-up view of an annular target inserted to retrofit a single-target PVD chamber in a multi-target PVD chamber.

Referring now to FIG. 2, the lower surface of processing chamber lid 26 and annular-shaped target assembly 24 are depicted as viewed from substrate 16. Substrate 16 is exposed to target 30 in the central deposition area defined by lines 34 of FIG. 1 so that material from target 30 transfers within the process chamber onto substrate 16 through the opening defined by the interior circumference of annular target 40. Upper lip 38 blocks transfer of material from target 30 onto target 40. Target 40 has a circular ring shape with an opening whose center aligns with a portion of substrate surface to allow material from target 30 to pass to substrate 16. FIG. 2A illustrates one of many paths that material follows from target 30 to substrate 16 through the central deposition area defined by the inner diameter of annular target 40, and the path of material from target 40 to substrate 16. For example, target 40 has an inner diameter of approximately nine inches and an outer diameter of approximately fourteen inches. The outer diameter of target 30 is approximately nine inches so that substrate 16 has uniform material deposition from target 30 without excessive deposition of material on upper lip 38.

In operation, deposition processing chamber 10 provides dual-target physical-vapor deposition, such as for laminates and extended mean-wafers-between-clean (MWBC) physical-vapor deposition, without a need for transferring substrate 16 into and out of deposition processing chamber 10 between deposition layers. For instance, dual targets support in-situ plasma sputtering of thin film laminates, such as high-moment stacks, lamination of reactively sputtered and non-reactively sputtered dielectric films, and laminates of dielectrics such as ONO, and multilayer optical stacks in a single physical-vapor deposition processing chamber.

One example of the operation of annular-shaped target assembly 24 is the deposition of alternating thin films of FeTaN and aluminum oxide. Deposition is initiated from an FeTa target 30 onto substrate 16 to establish an FeTaN film of desired thickness. Shutter 22 may be used to aid the initiation of plasma for deposition of the first iron layer. Once the desired thickness of FeTaN is established, power to FeTa target 30 is gradually ramped down as power to aluminum oxide target 40 is ramped up. In this manner, a consistent plasma is maintained in deposition processing chamber 10 until deposition of aluminum oxide is established. Power to FeTa target 30 is then cut off as power to aluminum oxide target 40 is established at the desired level. Once a desired thickness of aluminum oxide is deposited on substrate 16, power to FeTa target 30 is applied and gradually ramped up as power to aluminum oxide target 40 is decreased and eventually shut off. Alternating deposition between FeTaN and aluminum oxide is repeated until the desired number of thin film layers is deposited.

In addition to deposition of alternating layers of materials, annular target 40 together with target 30 allows control of process uniformity for the deposition of a single material layer. For instance, co-deposition of different materials from target 30 and annular target 40 result in the deposition of an alloy thin film layer having a composition that depends upon the deposition rate from each target and the position of substrate support 14. The uniformity of the film deposited on substrate 16 may be controlled by altering the height of substrate support 14 relative to the offset axis 46 of annular target 40. A generally uniform film results when offset axis 46 intersects at approximately the center of substrate 16. From this position, raising substrate support 14 allows deposition with a film of greater thickness deposited on the outer edge of substrate 16. Lowering of substrate support 14 allows deposition with a film of greater thickness deposited on the inner portion of substrate 16. In-situ measurement of film thickness uniformity during processing allows real-time adjustment of the height of substrate support 14 to result in desired film thickness uniformity.

Figure 3:
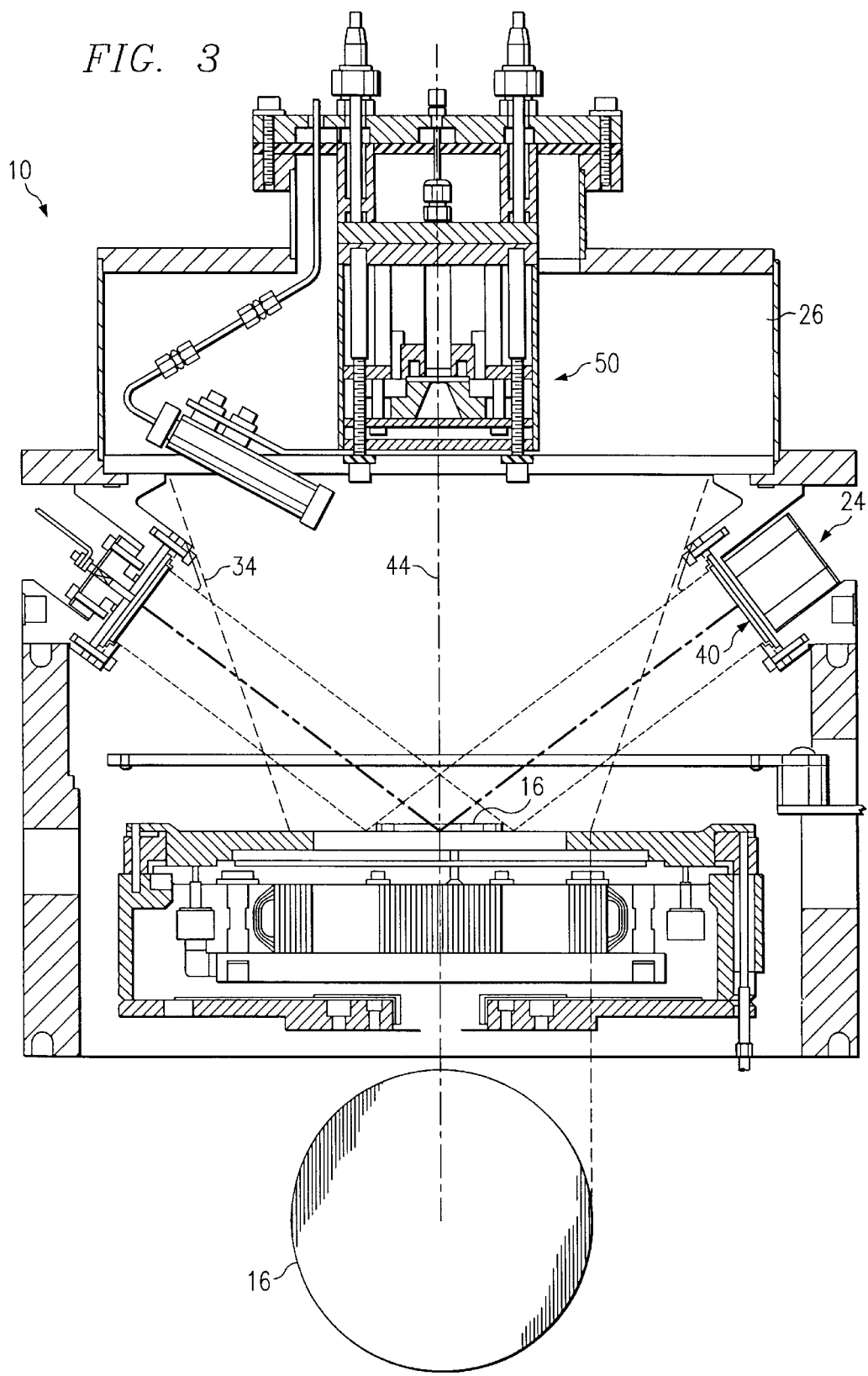
FIG. 3 depicts a side cutaway view of an apparatus for physical vapor deposition of a material from an annular physical deposition target assisted by an ion source.

Referring now to FIG. 3, a side cut away view of deposition processing chamber 10 is depicted with processing chamber lid 26 supporting an ion source 50 instead of a PVD target. Ion source 50 provides an inert or reactive ion stream for ion-assisted PVD sputtering with improved control of substrate film microstructure.

Ion source 50 may be a low energy gridless ion source, such as Veeco's MK.II end HALL source, or may also be a gridded ion source. Ion source 50 provides a stream of energetic ion species along central axis 44 towards substrate 16. Annular target assembly 24 has an opening that defines a deposition area depicted by line 34 through which ions pass towards substrate 16. An inert ion stream is directed toward substrate 16 when an inert plasma is provided in processing chamber 10, such as an argon-based plasma. A reactive ion stream is directed towards substrate 16 when a reactive plasma is provided in deposition processing chamber 10, such as an oxygen or nitrogen-based plasma.

Material from target 40 is deposited on substrate 16 with physical-vapor deposition. The ion stream assists the deposition of material from target 40 through the interaction of energetic ion species and the deposited material proximate the substrate 16 surface. For instance, the interaction of material from target 40 and the ion stream from ion source 50 acts to improve the fraction of material atoms that impinge on the side walls of high aspect ratio trenches and vias patterned on the surface of substrate 16.

Ion-assisted PVD sputtering of a material onto a substrate supports a deposition of a number of types of material films, such as the deposition of seed or bulk copper layers for microelectronic devices, or material layers for magnetic tunnel junction thin-film heads. For example, ion assisted PVD sputtering of copper establishes an excellent seed layer for subsequent CVD copper or electroplating deposition. Concurrent deposition of copper from target 40 and exposure of an inert ion stream from ion source 50 improves step coverage of the PVD copper to deposit a continuous seed layer film at the bottom of trenches and vias. Subsequent CVD of copper nucleates uniformly and homogeneously with minimal nucleation delay on the PVD seed copper layer, resulting in excellent adhesion and minimal interface contamination. Alternatively, sequential exposure to PVD copper followed by exposure to an ion stream mimics atomic layer deposition. For example, thin PVD film layers of approximately 10 angstroms that are subsequently treated by the ion stream have improved adhesion and uniformity on the surface of substrate 16. Advantageously, the inclusion of both the copper PVD target and the ion source in a single processing chamber minimizes the need for substrate movement and the risk of introduction of impurities to the substrate between PVD and ion treatments.

Another example of an application of the embodiment depicted in FIG. 3 is the deposition of aluminum oxide or silicon oxide. Aluminum is deposited from target 40 onto substrate 16 as a film having a thickness of five to ten angstroms. Once the aluminum film is deposited, a reactive ion stream formed in an oxygen-based plasma is directed at substrate 16 from ion source 50 to convert the aluminum film into aluminum oxide. Aluminum deposition, followed by sequential ion treatment is repeated until an aluminum oxide film of desired thickness is deposited. Alternatively, concurrent aluminum deposition from target 40 and reactive ion stream treatment from ion source 50 may be performed for deposition of a film of desired thickness of aluminum oxide. Alternative materials, such as silicon as a deposition material, and alternative reactive ion plasma, such as nitrogen, may also be used. Further, combination with a shutter target allows deposition of additional material layers.

Figure 4:
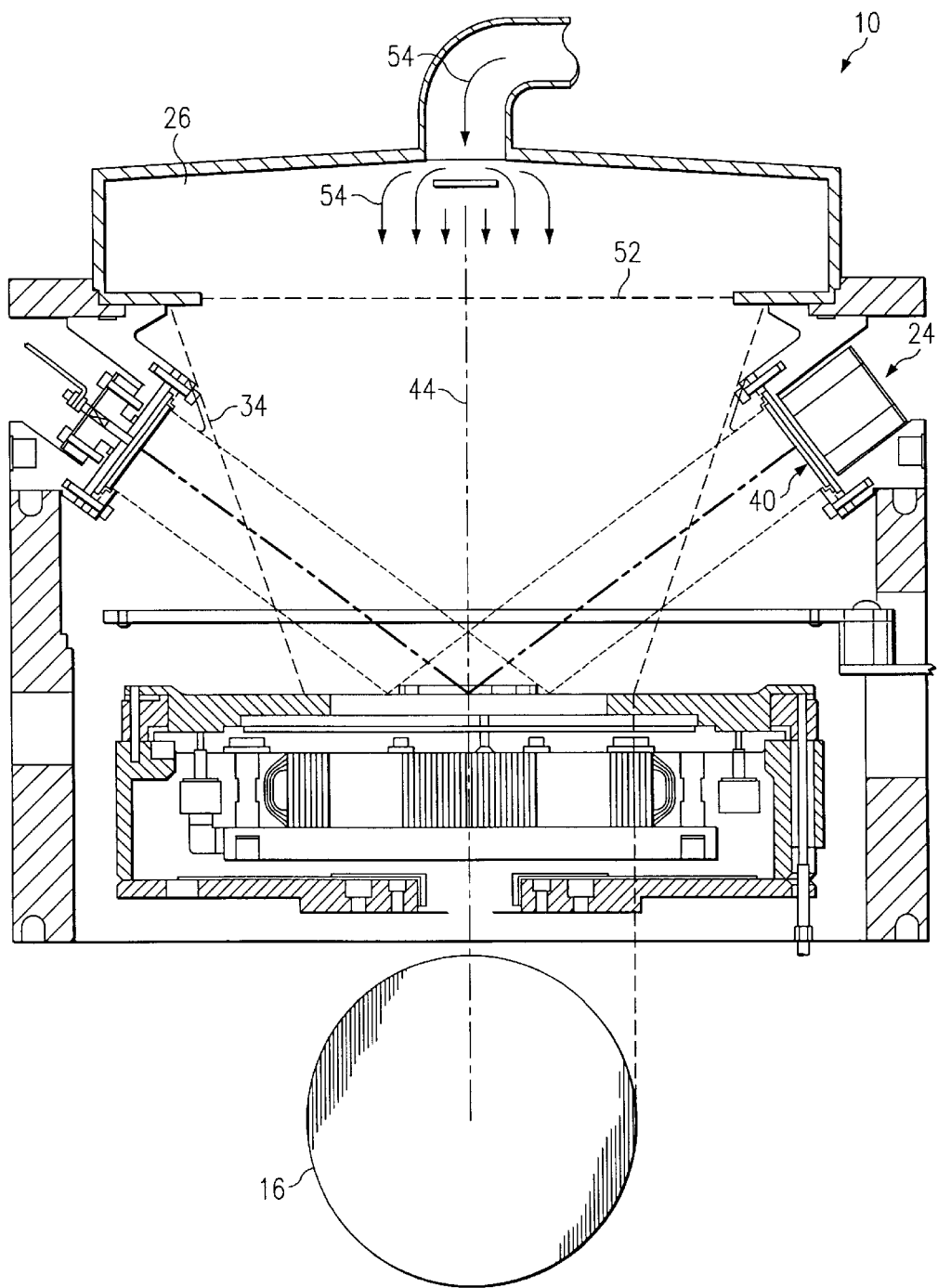
FIG. 4 depicts a side cutaway view of an apparatus for chemical vapor deposition of material assisted by energetic species from an annular physical vapor deposition target.

Referring now to FIG. 4, a side cut away view of a deposition processing chamber 10 is depicted as having a processing chamber lid 26 which is a chemical-vapor deposition showerhead 52. CVD showerhead 52 provides precursor gas to substrate 16 for CVD of a material on substrate 16. The precursor gas flows as indicated by arrows 54 through the deposition area defined by lines 34 as formed by the opening of annular target assembly 24. Precursor from showerhead 52 and material from target 40 of annular target assembly 24 cooperate to provide physically-assisted chemical-vapor deposition of one or more materials. Material from target 40 may either form a seed to assist deposition by precursor from showerhead 52, or may provide energetic species, such as energetic material atoms to assist the CVD process.

In another embodiment annular target assembly 24 could be replaced with an ion source such as a gridless ion source for ion assisted CVD.

One example in which the combination of a CVD showerhead and PVD target in a single processing chamber provides improved film deposition is the deposition of a copper film. For instance, copper from target 40 is first deposited via PVD onto substrate 16 to form a thin copper seed layer. Once a seed layer of adequate thickness, such as 100 angstroms, is deposited from target 40, CVD of copper proceeds by precursor flowing from showerhead 52. One significant advantage provided by the combination of the PVD target and CVD showerhead in a single processing chamber is that the substrate remains in the same chamber for deposition of both a seed layer and bulk layer, reducing the risk of contaminants.

In another application, deposition of copper from target 40 and from a precursor flowing from showerhead 52 may occur simultaneously so that the energetic copper atoms from target 40 aid the deposition of copper from the precursor. This allows lowering of the deposition temperature sufficiently to suppress spontaneous deposition from the precursor so that the energetic copper atoms drive the CVD reaction to completion. The lowering of the deposition temperature tends to reduce premature decomposition of hfac-based precursors, while the energetic copper atom species ensure that the CVD reaction proceeds rapidly with minimal delay.

Figure 5:
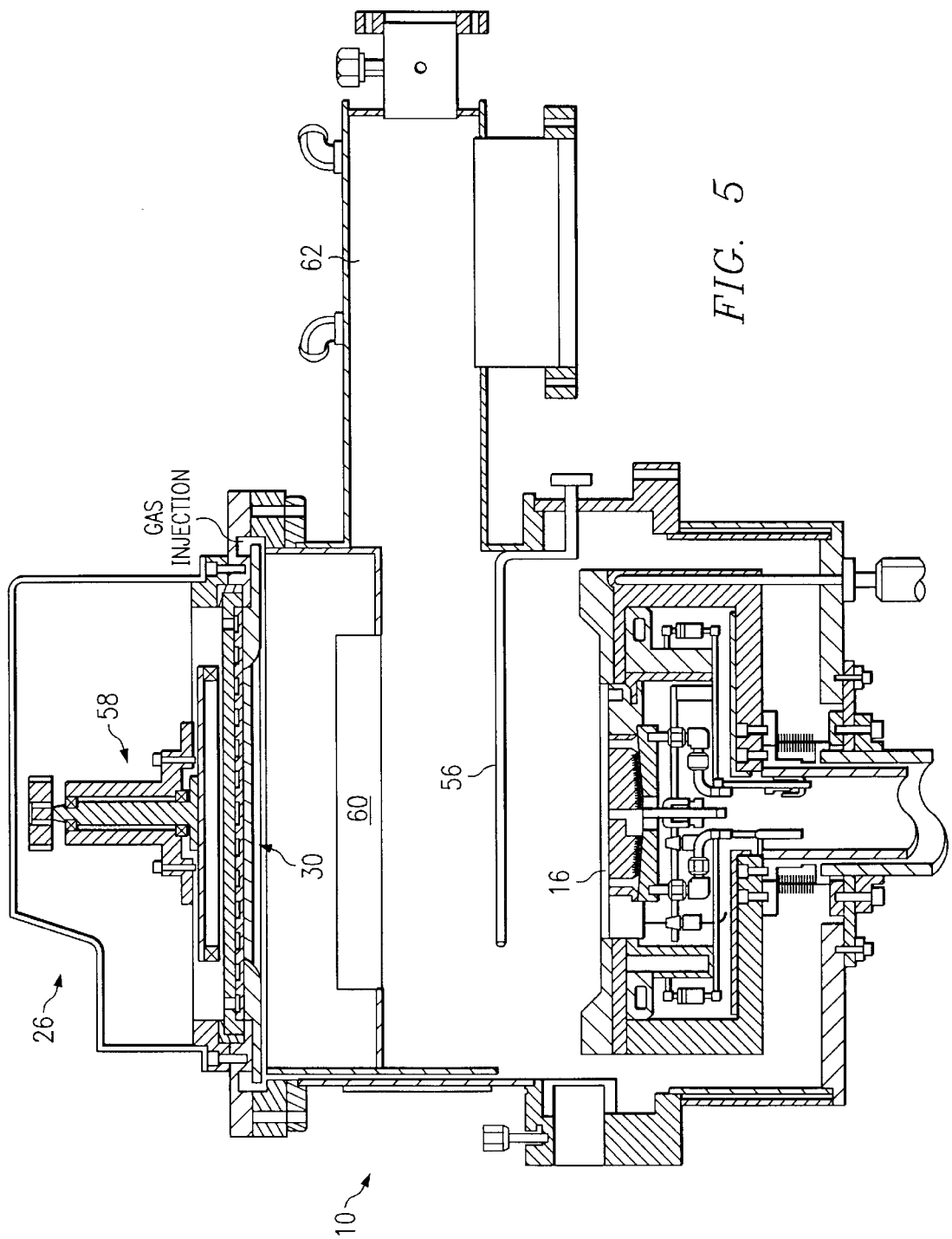
FIG. 5 depicts a side cutaway view of an apparatus for chemical vapor deposition of a material assisted by energetic species provided through a collimator.

Although PVD-assisted CVD allows lower deposition temperatures, some difficulty may be encountered when CVD precursors are exposed to the PVD plasma. Referring now to FIG. 5, an alternative system for PVD assisted CVD is depicted. Deposition processing chamber 10 supports chemical-vapor deposition on a substrate 16 with a precursor injection ring 56. Processing chamber lid 26 includes a DC magnetron cathode 58 that enables PVD from target 30 to substrate 16 through a physical collimator 60. Physical collimator 60 collimates material atoms from target 30 on their way to substrate 16. In an alternative embodiment, processing chamber lid 26 supports an ion source, such as a gridless or gridded ion source, that provides energetic ion species through a physical collimator 60 towards substrate 16.

Physical collimator 60 is interposed between target 30 and substrate 16, effectively dividing deposition processing chamber into two subchambers, one above the collimator and one below the collimator. Collimator 60 acts as a plasma shield that keeps the plasma that is sustained at the face of target 30, or the exit of an ion source in the place of target 30, from reaching substrate 16. However, energetic species such as ions or atoms pass through collimator 60 to interact with precursor in the lower subchamber. Electron impact with the precursor aids the disassociation of material in the precursor for deposition on substrate 16. Thus, collimator 60 allows passage of energetic species while maintaining plasma containing regions free of precursor. A pumping manifold 62 removes gas that escapes from the upper chamber through collimator 60 and also prevents precursor injected through precursor injection ring 56 from entering the plasma in the upper chamber above collimator 60. In addition, the upper surface of collimator 60 may be heated to react any precursor that does diffuse through holes of collimator 60, insuring that plasma in the upper chamber above collimator 60 remains the void of precursor.

One key example of a deposition application using the system depicted by FIG. 5 is the deposition of copper with conventional hfac-based copper precursors, such as Cupra-Select. Interaction of energetic species, such as copper atoms ejected from target 30 or ions from an ion source, with hfac-based copper precursors allows deposition at lower temperatures, thereby reducing premature decomposition of the precursor.

Substrate 16 is first degassed to remove residual moisture, then reactively etched in a low energy plasma to chemically remove copper oxide, and covered with a barrier layer. These initial steps are performed in a cluster tool environment which minimizes air exposure between steps.

Substrate 16 is next secured in processing chamber 10 and a seed layer having at thickness of between 100 and 200 angstroms is deposited on substrate 16 by PVD from target 30. PVD is accomplished with a wafer temperature of less than 100 degrees Celsius to reduce the propensity for the PVD copper to agglomerate. The PVD copper seed layer improves the adhesion of subsequently deposited CVD copper, and provides a surface on which the copper precursor can adsorb without hfac precursor decomposition. Although the step coverage of the PVD copper seed layer may not achieve a continuous PVD copper film within the trench and via features of substrate 16, the step coverage of collimated PVD copper is sufficient to deposit a continuous film at the bottom of trench and via features resulting in enhanced low via resistance.

Once the PVD copper seed layer is deposited, substrate 16 is heated for CVD deposition, such as by clamping substrate 16 to support chuck 14 and flowing backside gas. The CVD deposition temperature is 30–60 degrees C. lower than the temperature used for conventional CVD when the precursor is subjected to energetic species, such as energetic ions or copper atoms. At the lower temperature, deposition rates are 30–60 angstroms per minute in the absence of bombardment by energetic species from target 30. Once substrate 16 is heated, copper precursor is flowed from injection ring 56 and a copper atom flux is applied from target 30 to deposit a conformal, continuous, thin CVD copper film having a thickness of less than 200 angstroms. Precursor flow and copper atom flux may be applied in sequence one after the other, mimicking the ALD process, or maybe applied simultaneously. Deposition pressure is maintained at approximately 1–10 MTOR for compatibility with the PVD sputtering from target 30. Next, conventional CVD is used to complete deposition of a bulk copper film of desired thickness, either in processing chamber 10, or after transfer to another processing chamber.

If an ion source is used instead of target 30, ion assisted CVD follows essentially the same process as PVD assisted CVD except that ion flux is used instead of copper atom flux to aid in disassociation of copper from the precursor. The initial PVD copper deposition of a seed layer may either be skipped or performed in a separate module.

Although the present invention has been described in detail, it should be understood that various changes, substitutions and alterations can be made hereto without departing from the spirit and scope of the invention as defined by the appended claims.

What is claimed is:

1. An apparatus for chemical-vapor deposition of a material onto a substrate comprising:
   a processing chamber;
   a substrate support disposed in the processing chamber;
   a precursor distributor arranged to distribute a chemical-vapor deposition precursor towards the substrate support;
   an energetic species source directed at the substrate support to aid the disassociation of the material from the precursor;
   a collimator disposed between the energetic species source and the substrate support, the collimator establishing first and second sub-chambers within the processing chamber; and
   a heating element associated with the collimator for reacting precursor flowing towards the first sub-chamber.

2. The apparatus of claim 1 wherein the energetic species source comprises an ion source.

3. The apparatus of claim 1 wherein the energetic species source comprises a physical-vapor deposition target.

4. The apparatus of claim 3 wherein the target comprises an annular shape having an opening corresponding to a deposition area through which the precursor flows.

5. The apparatus of claim 1 further comprising the first sub-chamber supporting a plasma associated with the energetic species source.

6. The apparatus of claim 5 wherein the plasma comprises an inert ion stream.

7. The apparatus of claim 5 wherein the plasma comprises energetic atoms from a physical-vapor deposition target.

8. The apparatus of claim 1 wherein the second sub-chamber supports precursor flow over a substrate secured by the substrate support, the precursor flow subject to energetic species provided through the collimator by the energetic species source.

9. The apparatus of claim 1 further comprising a pumping manifold interfaced with the processing chamber, the pumping manifold for removing precursor flowing from the precursor distributor towards the first sub-chamber.

10. The apparatus of claim 1 further comprising a pumping manifold interfaced with the processing chamber, the pumping manifold for removing plasma species flowing from the first sub-chamber towards the second sub-chamber.

11. The apparatus of claim 1 further comprising a copper precursor distributed from the precursor distributor for depositing copper on a substrate secured by the substrate support.

12. The apparatus of claim 11 wherein the energetic species source comprises a copper physical-vapor deposition target that provides energetic copper atoms to the precursor.

13. A method for chemical-vapor deposition of a material on a substrate, the method comprising:
   flowing a chemical-vapor deposition precursor over the substrate, the precursor having a deposition temperature;
   subjecting the precursor to energetic species to aid the disassociation of the material from the precursor until a seed layer is deposited; and
   wherein the seed layer is deposited with a substrate temperature of substantially less than the deposition temperature.

14. The method of claim 13 wherein the energetic species comprises ions provided from an ion source.

15. The method of claim 13 wherein the energetic species comprises energetic atoms provided from a physical-vapor deposition target.

16. The method of claim 13 wherein the precursor comprises an hfac-based copper precursor.

17. The method of claim 16 wherein the material comprises copper.

18. The method of claim 17 wherein the energetic species comprises copper atoms from a copper physical-vapor deposition target.

19. The method of claim 13 wherein the subjecting step further comprises providing energetic copper atom species from an annular physical-vapor deposition target.

20. The method of claim 19 wherein the flowing step further comprises flowing the precursor from a showerhead through an opening of the annular target.

21. The method of claim 13 wherein the subjecting step further comprises:
  providing energetic copper atom species from a physical-vapor deposition target;
  collimating the energetic copper atom species with a collimator;
  directing the collimated copper atom species at the precursor.

22. The method of claim 21 further comprising:
  dividing a processing chamber into first and second sub-chambers with the collimator;
  establishing a plasma for physical-vapor deposition in the first sub-chamber; and
  flowing the precursor over the substrate in the second sub-chamber.

23. A method for depositing copper on a substrate, the method comprising:
  flowing a precursor over the substrate, the precursor comprised of copper and having a deposition temperature;
  subjecting the precursor to energetic species to aid the disassociation of the copper from the precursor until a seed layer is deposited; and
  wherein the seed layer is deposited with a substrate temperature of substantially less than the deposition temperature.

24. The method of claim 23 wherein the energetic species comprise energetic ion species from an ion source.

25. The method of claim 24 wherein the ion source comprises a gridless ion source.

26. The method of claim 23 further comprising:
  directing the energetic species through a collimator and then at the precursor.

27. The method of claim 23 wherein the energetic species comprise energetic atom species from a physical-vapor deposition target.

28. The method of claim 27 wherein the energetic atom species comprise copper atoms.

29. The method of claim 23 further comprising:
  depositing a bulk copper layer by chemical-vapor deposition using the precursor without energetic species.

30. The method of claim 23 wherein the seed layer substrate temperature is between 30 and 60 degrees Celsius below the deposition temperature.

31. The method of claim 23 wherein the energetic species comprise energetic copper atoms from a physical-vapor deposition target, the method further comprising:
  depositing a copper seed layer on the substrate with the physical-vapor deposition target before the flowing the precursor step.

32. The method of claim 31 wherein the physical-vapor deposition target comprises an annular ring.

* * * * *